United States Patent [19]
Gruender, Jr. et al.

[11] Patent Number: 5,440,181
[45] Date of Patent: Aug. 8, 1995

[54] CONFIGURATION CIRCUIT FOR CONFIGURING A MULTI-BOARD SYSTEM AUTOMATICALLY

[75] Inventors: Eugene H. Gruender, Jr.; Douglas R. Kraft, both of Austin, Tex.

[73] Assignee: Motorola, Inc., Schaumburg, Ill.

[21] Appl. No.: 194,291

[22] Filed: Jan. 31, 1994

[51] Int. Cl.$^6$ .............................................. H05K 1/00
[52] U.S. Cl. .................... 307/156; 361/735; 361/760; 361/761
[58] Field of Search ............... 361/735, 744, 760, 761, 361/792; 174/250, 256, 262

[56] References Cited

U.S. PATENT DOCUMENTS 4,733,461  3/1988  Nakano .................... 29/830

Primary Examiner—Peter S. Wong
Assistant Examiner—Aditya Krishnan
Attorney, Agent, or Firm—Harold C. McGurk, IV; S. Kevin Pickens

[57] ABSTRACT

A system including a number of circuit boards is provided that configures itself automatically. Any number of circuit boards can be placed in any order including sandwich arrangements where the circuit boards automatically configure themselves without any manual intervention by a skilled individual changing jumpers or strapping devices. The multi-board system removes the possibility of an error occurring while configuring the memory and registers.

3 Claims, 2 Drawing Sheets

CONFIGURATION CIRCUIT FOR CONFIGURING A MULTI-BOARD SYSTEM AUTOMATICALLY

TECHNICAL FIELD

This invention relates generally to multi-board systems and, in particular, to a multi-board system that configures itself automatically when any number of circuit boards are added, removed or rearranged.

BACKGROUND OF THE INVENTION

At initialization of conventional multi-board systems, each circuit board attempts to locate its memory, interrupt addresses, registers, bus grants, etc., at the same address. A number of jumpers or strapping devices are used to configure or memory map the memory, interrupt addresses and registers so that they do not overlap. However, most conventional systems require a qualified individual who can reconfigure the circuit boards to place the jumpers or strapping devices in the proper position and/or location so that each circuit board is configured in a particular order.

When plugging a mezzanine (or daughter) circuit board onto either side of a master circuit board (or a mother board), enable signals are sent in a daisy chain fashion from one circuit board to another circuit board. Therefore, if a mezzanine board is placed on top of the master board, the enable signals are passed from the master board to the mezzanine board. If the mezzanine board is placed on the other side of the master board, the enable signals are passed in that direction from the master board to the mezzanine board. However, a skilled person is needed who knows how to manually change the jumpers or strapping devices on both the master and mezzanine boards so that the enable signals travel in the proper direction.

If mezzanine boards are to be placed on both sides of the master board, the jumpers or strapping devices will have to be changed by a skilled person. In other words, each time the master and mezzanine boards are rearranged, jumpers or strapping devices are required so that the entire system initializes and configures correctly and functions properly. Thus, there is a significant need for a multi-board system which eliminates the intervention of a skilled person for changing jumpers or strapping devices whenever the master and mezzanine boards are rearranged.

SUMMARY OF THE INVENTION

The present invention has utility in allowing any number of circuit boards to be added, removed or placed in any order including sandwich arrangements where the circuit boards automatically configure themselves without any manual intervention by a skilled individual.

Thus it is an advantage of the present invention to configure automatically any number of circuit boards by using a configuration circuit.

It is also an advantage of the present invention to eliminate the need for a skilled individual to manually change jumpers or strapping devices.

Yet another advantage of the present invention is to remove the possibility of an error in configuration or placement of circuit boards.

According to one aspect of the invention, a system comprises a master board and a mezzanine board coupled to the master board. Each of the boards comprises configuration means for receiving an enable signal and producing a disable signal. The configuration means of the master board is coupled to the configuration means of the mezzanine board so that one configuration means of one of the boards is enabled and configuring itself and is producing a disable out signal to disable the configuration means of the other circuit board until completion of configuration of the one of the boards.

DESCRIPTION OF THE PREFERRED EMBODIMENTS

Figure 1:
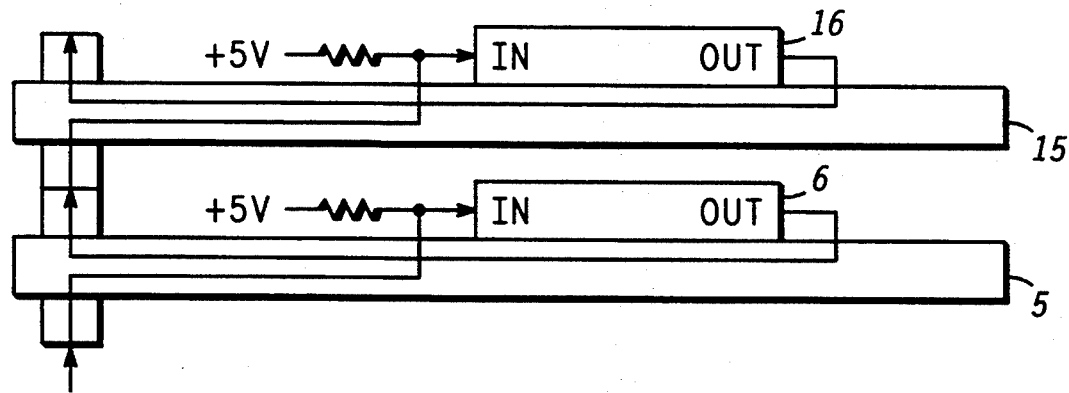
FIG. 1 depicts an arrangement of a master board and a mezzanine circuit board in accordance with a preferred embodiment of the present invention.

FIG. 1 shows configuration circuit 6 of master board 5 coupled to configuration circuit 16 of mezzanine board 15 in accordance with a preferred embodiment of the present invention. Master board 5 may be a commercially available VME197 circuit board available from Motorola, Inc., while mezzanine board 15 may be a VME297 circuit board which is also available from Motorola, Inc. Although the present invention uses circuit boards which are commercially available from Motorola, Inc., this invention is not limited to circuit boards only available from Motorola, Inc.

Both configuration circuit 6 of master board 5 and configuration circuit 16 of mezzanine board 15 have an "IN" and an "OUT". The "IN" is coupled to a resistor which is coupled to a five volt power supply. When the "IN" of a configuration circuit is low, the configuration circuit is disabled. When the "IN" of a configuration circuit is high, the configuration circuit is enabled and initialization and configuration is performed. Once a circuit board completes initialization, the "OUT" of the configuration circuit goes high passing the enable to the "IN" of the configuration circuit of the next circuit board (which is stacked on top). Thus, the rule of configuration is that the lowest board in the chain is enabled first followed by the other circuit boards stacked on top of it. In other words, the lowest or the bottom circuit board, in this case master board 5, is enabled and initialized first followed by mezzanine circuit board 15.

Upon initialization of the system, the "IN" of configuration circuit 6 of the first or lowest circuit board in the daisy chain of circuit boards (i.e., master board 5) is high because it is coupled to the five volt power supply through the resistor. However, the "OUT" of configuration circuit 6 is low which disables configuration circuit 16 of mezzanine board 15. On the first access, master board 5 configures its own addressable memory (memory and registers. After master board 5 initializes and configures itself, the disable "OUT" of configuration circuit 6 of master board 5 goes high, passing an enable to the next circuit board or mezzanine board 15 in the chain. This allows master board 5 to see the addressable memory (memory and resistors) of mezzanine board 15. After master board 5 configures the memory and registers of the top mezzanine board 15, master board 5 sees nothing else at the initial location because there are no more circuit boards on top of mezzanine board 15.

Once configuration circuit 16 of mezzanine board 15 is enabled, master board 5 will be permitted to configure the memory and registers of mezzanine board 15. For example, when mezzanine board 15 is configuring its memory, it looks at the initial common address. Mezzanine board 15 determines that memory of mezzanine board 15 is located at the same initial common address. Thus, once its memory is configured, mezzanine board 15 changes its address to a new address in the memory map. When master board 5 finds no more responses at the initial address, all circuit boards have been configured. Master board 5 has no need to know how many circuit boards there are and no need to control the configuration or enable-disable functions.

In the present invention, master board 5 is responsible for configuring all memory and registers in the system. In most applications, such as in a VME197 and VME297 arrangement, memory (DRAM) and associated controllers are located on mezzanine board 15. Although the controller which performs the configuration could be on any circuit board rather than on master board 5, it is preferred that the controller be on master board 5.

Figure 2:
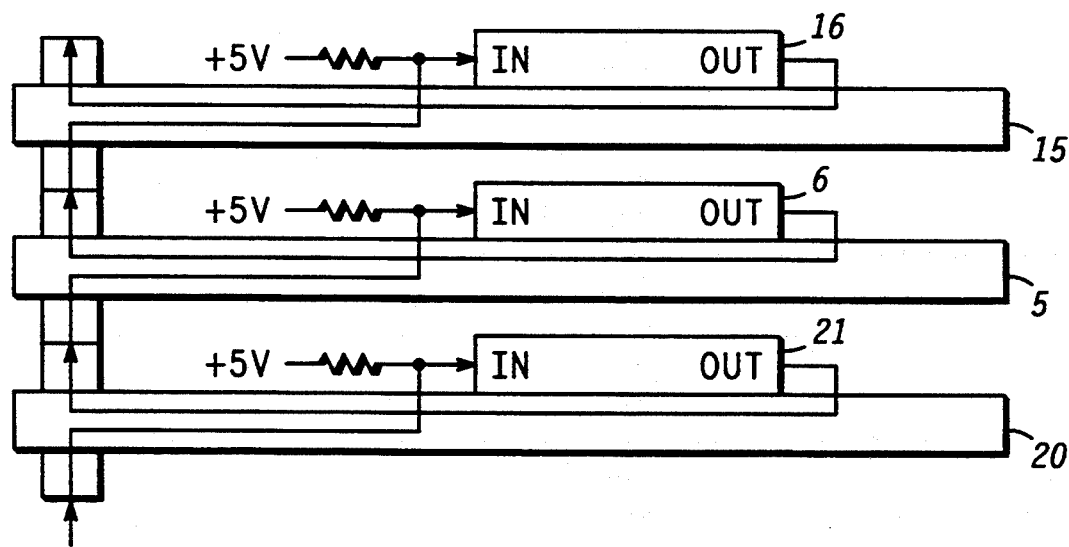
FIG. 2 depicts an arrangement of a master board and two mezzanine boards in accordance with a preferred embodiment of the present invention.

FIG. 2 shows a circuit board arrangement where another mezzanine board 20 is added to the bottom of master board 5 in accordance with a preferred embodiment of the present invention. Mezzanine board 20 may be similar to mezzanine board 15. Configuration circuit 21 of mezzanine board 20 is coupled to configuration circuit 6 of master board 5. Likewise, configuration circuit 6 of master board 5 is coupled to configuration circuit 16 of mezzanine board 15. As shown in FIG. 2, configuration circuits 6, 16, 21 are daisy chained together.

The daisy chain signal when low disables the rest of the chain. The signal if high passes the enable to the next circuit board in the stack. In the three-board arrangement shown in FIG. 2, the input or "IN" to mezzanine board 20 is pulled high while the "IN" of master board 5 and mezzanine board 15 are low. In other words, the disable "OUT" of the lower mezzanine board 20 is low, but its input "IN" is high. Thus, the first access from master board 5 will not see its own registers and memory, but the registers and memory of the lower mezzanine board 20. After mapping the registers and memory of mezzanine board 20, the disable "OUT" of lower mezzanine board 20 will go high. Subsequently, the next access at the same address by master board 5 will find its own registers. After mapping these registers, the same sequence will be followed as described in relation to FIG. 1 for registers and other initialization functions of mezzanine board 15.

Figure 3:
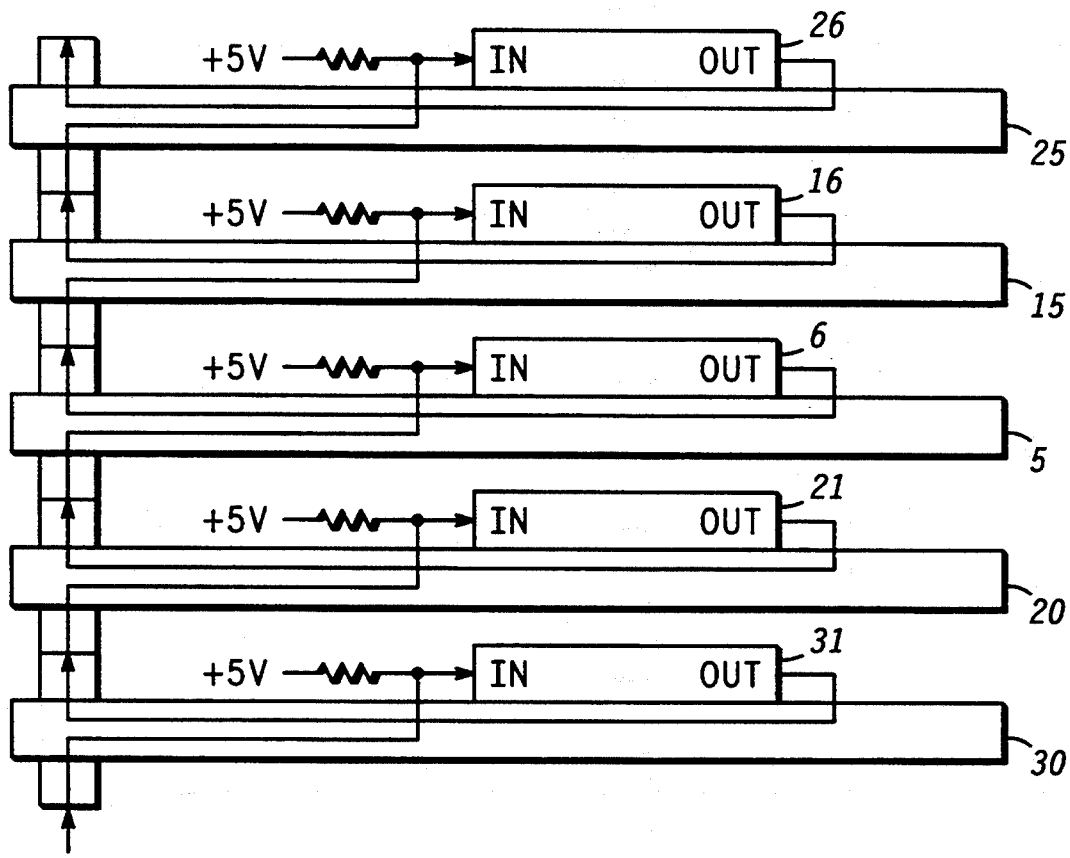
FIG. 3 depicts an arrangement of a master board and four mezzanine boards in accordance with a preferred embodiment of the present invention.

FIG. 3 shows a multiple mezzanine circuit board arrangement with two top mezzanine boards 15, 25 and two bottom mezzanine boards 20, 30. Configuration circuit 31 of mezzanine board 31 is coupled to configuration circuit 21 of mezzanine board 21 which is in turn coupled to configuration circuit 6 of master board 5. Configuration circuit 6 of master board 5 is likewise coupled to configuration circuit 16 of mezzanine board 15 which is coupled to configuration circuit 26 of mezzanine board 25. The configuration of the arrangement operates just as described above with the bottom mezzanine board 30 being enabled, initialized and configured first, followed by mezzanine board 20, master board 5, mezzanine board 15 and mezzanine board 25. Thus, the present invention permits any number of mezzanine boards to be placed on either side with no manual configuration of jumpers or strapping devices.

It will be appreciated by those skilled in the art that the present invention permits configuration automatically of the initialization functions including memory mapping and assigning addresses to registers without having a skilled individual manually reconfigure jumpers or strapping devices. Moreover, the invention permits any number of circuit boards to be added, removed or placed in any order including sandwich arrangements where the circuit boards automatically configure themselves without any manual intervention.

Accordingly, it is intended by the appended claims to cover all modifications of the invention which fall within the true spirit and scope of the invention. For example, although the current application is used to configure between circuit boards in a multi-board set, it could also be used to configure daisy chains in a system using a backplane and multiple circuit boards. Moreover, instead of passing the disable signal between circuit boards, other signals such as bus requests, bus grants and interrupts could be passed between the circuit boards. Moreover, the enable signal could be low true instead of high true. Similarly, the disable signal could be high true instead of low true.

What is claimed is:

1. A system comprising:
    a master board having addressable memory; and
    a mezzanine board having addressable memory and coupled to the master board,
    each of the boards comprising configuration means for receiving an enable signal and producing a disable signal, the configuration means of the master board being coupled to the configuration means of the mezzanine board so that one configuration means of one of the boards is enabled and configuring the addressable memory of the one of the boards having the enabled configuration means and is producing a disable out signal to disable the configuration means of the other board until completion of configuration of the addressable memory of the one of the boards.

2. A system comprising:
    a master board having addressable memory; and
    a plurality of mezzanine boards having addressable memory and coupled to one of the master board and one of the mezzanine boards,
    each of the boards comprising configuration means for receiving an enable signal and producing a disable signal, the configuration means of the master board being coupled to the configuration means of the mezzanine boards so that one configuration means of the one of the boards is enabled and configuring the addressable memory of the one of the boards having the enabled configuration means and is producing a disable out signal to disable the configuration means of the other boards until completion of configuration of the addressable memory of the one of the boards.

3. A system comprising:
    a master board having addressable memory; and
    a mezzanine board coupled to the master board,
    each of the boards having addressable memory and comprising a configuration circuit for receiving an enable signal and producing a disable signal, the configuration circuit of the master board being coupled to the configuration circuit of the mezzanine board so that one configuration circuit of the one of the boards is enabled and is configuring the addressable memory of the one of the boards having the enabled configuration circuit and is producing a disable out signal to disable the configuration circuit of the other board until completion of configuration of the addressable memory of the one of the boards.

* * * * *